United States Patent
Jin et al.

(10) Patent No.: US 8,860,017 B2
(45) Date of Patent: Oct. 14, 2014

(54) ORGANIC LIGHT EMITTING DISPLAY DEVICE AND MANUFACTURING METHOD THEREOF

(71) Applicant: Samsung Display Co., Ltd., Yongin (KR)

(72) Inventors: Guang-Hai Jin, Yongin (KR); Dong-Gyu Kim, Yongin (KR); Jae-Beom Choi, Yongin (KR); Kwan-Wook Jung, Yongin (KR); Jae-Hwan Oh, Yongin (KR); Na-Young Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/648,672

(22) Filed: Oct. 10, 2012

(65) Prior Publication Data

US 2013/0299784 A1 Nov. 14, 2013

(30) Foreign Application Priority Data

May 8, 2012 (KR) ........................ 10-2012-0048829

(51) Int. Cl.
*H01L 35/24* (2006.01)

(52) U.S. Cl.
USPC .................................... 257/40; 257/E51.001

(58) Field of Classification Search
CPC .............. H01L 51/045; H01L 51/0036; H01L 51/0541; H01L 51/5012; B82Y 10/00
USPC ............................................. 257/40, E51.001
See application file for complete search history.

(56) References Cited

U.S. PATENT DOCUMENTS

| | | | |
|---|---|---|---|
| 7,994,517 B2 | 8/2011 | Yang et al. | |
| 8,044,576 B2 | 10/2011 | Hwang | |
| 2007/0278480 A1 | 12/2007 | Hwang et al. | |
| 2011/0253987 A1 | 10/2011 | Chung et al. | |
| 2011/0297951 A1 | 12/2011 | Shin et al. | |
| 2012/0007083 A1 | 1/2012 | You et al. | |

FOREIGN PATENT DOCUMENTS

| | | |
|---|---|---|
| JP | 09-064356 | 3/1997 |
| KR | 10-2007-0115355 | 12/2007 |
| KR | 10-2008-0069892 | 7/2008 |

*Primary Examiner* — Anthony Ho
(74) *Attorney, Agent, or Firm* — Robert E. Bushnell, Esq.

(57) ABSTRACT

In an organic light-emitting display device and a method of manufacturing the same, the organic light-emitting display device includes: a silicon layer formed on a substrate; and a thin film transistor (TFT) and an organic light-emitting device that are formed on the silicon layer. The silicon layer comprises a conductive doping silicon portion for forming a part of an active layer included in the TFT and an insulating intrinsic silicon portion surrounding the doping silicon portion. According to the organic light-emitting display device of the present invention, manufacturing costs may be reduced due to a reduction in the number of masks, and the manufacturing process of the organic light-emitting display device may be simplified.

10 Claims, 5 Drawing Sheets

ORGANIC LIGHT EMITTING DISPLAY DEVICE AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 8$^{th}$ of May 2012 and there duly assigned Serial No. 10-2012-0048829.

BACKGROUND OF THE INVENTION

1. Field of the Invention

The present invention relates to an organic light-emitting display device and a method of manufacturing the same, and more particularly, to an organic light-emitting display device that is improved so as to reduce the frequency of use of a mask during a manufacturing process of the organic light-emitting display device, and a method of manufacturing the organic light-emitting display device.

2. Description of the Related Art

Organic light-emitting display devices are manufactured on a substrate on which a thin film transistor (TFT), a capacitor, etc., and a pattern including wiring lines for connecting the TFT, the capacitor, etc., are formed.

In general, to form a micro pattern including a TFT, etc. on a substrate in which an organic light-emitting display device is manufactured, a pattern is transferred to an array substrate by using a mask including a micro pattern.

A process of transferring a pattern by using a mask generally uses a photo-lithography process. According to the photo-lithography process, a photoresist is uniformly coated on a substrate on which a pattern is to be formed, the photoresist is exposed by an exposing apparatus such as a stepper, and then the exposed photoresist is developed (when the photoresist is a positive photoresist). After the photoresist is developed, a series of processes are performed. For example, the pattern is etched by using a remaining photoresist as a mask, and then an unnecessary photoresist is removed.

As such, in a process of transferring a pattern by using a mask, a mask including a necessary pattern should be prepared, and thus, as the number of processes using a mask is increased, manufacturing costs for preparing the mask are increased. Accordingly, there is a need to develop an organic light-emitting display device that less frequently uses a mask as much as possible.

SUMMARY OF THE INVENTION

The present invention provides an organic light-emitting display device that is improved so as to reduce a frequency of patterning operations using a mask, and a method of manufacturing the organic light-emitting display device.

According to an aspect of the present invention, there is provided an organic light-emitting display device including: a silicon layer formed on a substrate; and a thin film transistor (TFT) and an organic light-emitting device that are formed on the silicon layer; wherein the silicon layer includes a conductive doping silicon portion for forming a part of an active layer included in the TFT and an insulating intrinsic silicon portion surrounding the doping silicon portion.

The TFT may include a gate electrode facing the active layer and source and drain electrodes connected to the doping silicon portion.

The gate electrode may include a gate central portion facing the active layer and a gate peripheral portion having a closed-loop shape extending from the gate central portion.

The source and drain electrodes may pass through via a space of the closed-loop and are connected to the doping silicon portion.

The organic light-emitting device may include a pixel electrode electrically connected to the TFT, a counter electrode facing the pixel electrode, and an emission layer interposed between the pixel electrode and the counter electrode.

According to another aspect of the present invention, there is provided a method of manufacturing an organic light-emitting display device, the method including: (a) forming a silicon layer formed of an intrinsic silicon material over the entire area of a substrate in which an organic light-emitting device and a TFT are to be formed; (b) forming a metal layer on the silicon layer; (c) performing a primary patterning process on the metal layer so as to expose a part of an active layer of the TFT in the silicon layer and forming a doping silicon portion by doping impurities on the exposed silicon layer; (d) forming a pixel electrode of the organic light-emitting device and a gate electrode of the TFT by performing a second patterning process on the metal layer; (e) forming an insulating layer having an opening for exposing the pixel electrode and the doping silicon portion of the TFT; (f) forming source and drain electrodes contacting the doping silicon portion; and (g) forming a pixel define layer for exposing the pixel electrode and covering the TFT.

The primary patterning process may include an operation in which the metal layer is entirely removed in a portion where the silicon layer is to be exposed, an operation in which the metal layer is maintained in a portion where the pixel electrode and the gate electrode are to be formed, and an operation in which the metal layer partially remains in the rest of the portions by using a halftone mask.

The secondary patterning process may include an etching operation in which the metal layer remains in a portion where the pixel electrode and the gate electrode are to be formed and the metal layer is removed in the rest of the portions.

The gate electrode may be formed to include a gate central portion facing a part of the active layer and a gate peripheral portion having a closed-loop shape extending from the gate central portion, the doping silicon portion may be located at an inner side of the gate peripheral portion, and the silicon layer formed of an intrinsic silicon material is located at an outer side of the gate peripheral portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1A:
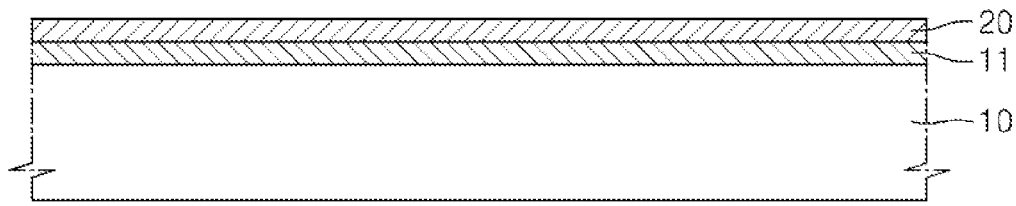
FIGS. 1A to 1H are cross-sectional views for describing a method of sequentially manufacturing an organic light-emitting display device according to an embodiment of the present invention.

Hereinafter, exemplary embodiments of the present invention will be described in detail with reference to the attached drawings. Like reference numerals designate like elements throughout the specification. In the description, the detailed descriptions of well-known functions and structures may be omitted so as not to hinder an understanding of the present invention. In the drawings, the thicknesses of layers and regions are exaggerated for clarity. It will also be understood that, when a layer is referred to as being "on" another layer or substrate, it can be directly on the other layer or substrate, or intervening elements may also be present.

FIGS. 1A to 1H are cross-sectional views for describing a method of sequentially manufacturing a bottom emission type organic light-emitting display device according to an embodiment of the present invention. Hereinafter, a process of forming a thin film transistor (TFT) and an organic light-emitting device of the organic light-emitting display device of the current embodiment will be described with reference to FIGS. 1A to 1H.

First, referring to FIG. 1A, a buffer layer 11 is formed on a substrate 10 so as to provide flatness and prevent permeation of impurity substances, and a silicon layer 20 is uniformly formed on the buffer layer 11.

The substrate 10 may be formed of a transparent glass material, and the silicon layer 20 may be formed of an insulating intrinsic poly silicon material.

Figure 1B:
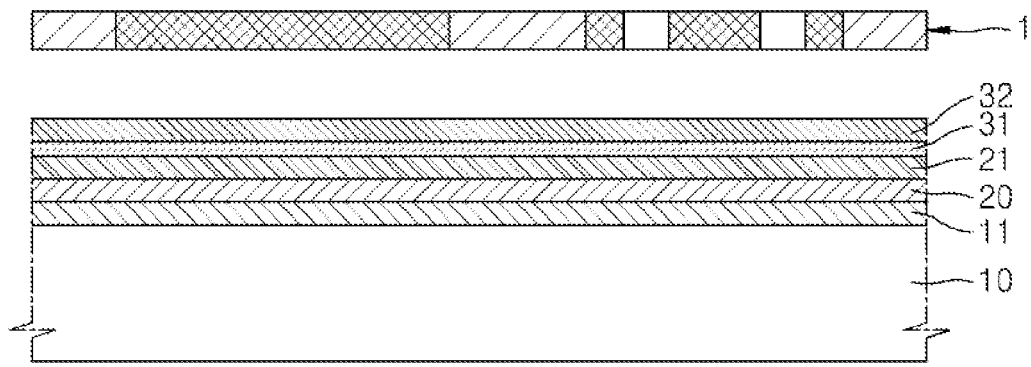

Then, as shown in FIG. 1B, a first insulating layer 21 is formed on the silicon layer 20. The first insulating layer 21 may be deposited with an inorganic insulating film such as SiNx or SiOx by using a plasma-enhanced chemical vapor deposition (PECVD) method, an atmospheric pressure chemical vapor deposition (APCVD) method, a low pressure chemical vapor deposition (LPCVD) method, or the like. In this regard, the first insulating layer 21 may be directly formed on the silicon layer 20 without performing an additional mask patterning operation for patterning an active layer in the silicon layer 20, and thus a mask process for forming the active layer may be omitted compared to a conventional method of manufacturing an organic light-emitting display device. However, a portion that serves as an active layer in the silicon layer 20 may be formed through a subsequent process.

After the first insulating layer 21 is formed, two conductive layers 31 and 32 are sequentially formed on the first insulating layer 21. The conductive layer 31 to be formed at a lower side from among the two conductive layers 31 and 32 may include at least one transparent material selected from the group consisting of indium tin oxide (ITO), indium zinc oxide (IZO), zinc oxide (ZnO), and $In_2O_3$. The transparent layer 31 serves as a pixel electrode of the organic light-emitting device and a lower electrode of a gate electrode of a TFT. The conductive layer 32 formed at an upper side from among the two conductive layers 31 and 32 is a metal layer including at least one metal selected from the group consisting of Ag, Mg, Al, Pt, Pd, Au, Ni, Nd, Ir, Cr, Li, Ca, Mo, Ti, W, MoW, and Al/Cu. The metal layer 32 is patterned with an upper electrode of a gate electrode.

After the two conductive layers 31 and 32 are formed, a primary patterning process is performed as a first mask process as shown in FIG. 1B by using a halftone mask 1. The primary patterning process is performed in such a way that the conductive layers 31 and 32 are in any one state from among a state where the conductive layers 31 and 32 entirely remain, a state where the conductive layers 31 and 32 remain by about 50%, and a state where the conductive layers 31 and 32 are entirely removed by using exposing, ashing, and etching operations. In other words, a portion to be a gate electrode of the TFT and a portion to be a pixel electrode of the TFT are in any one state so as to allow the conductive layers 31 and 32 to entirely remain. A part of the active layer, that is, a portion to be an area of the active layer to be connected to source and drain electrodes allows the conductive layers 31 and 32 to be entirely removed, and the rest of portions allow the metal layer 32 to remain by about 50%. For this, although not shown in FIG. 1B, a photoresist (not shown) is coated on the metal layer 32, the exposing operation is performed on the photoresist differentially according to parts by using the halftone mask 1, and then the ashing and etching operations are performed to allow the conductive layers 31 and 32 to undergo the above-described three states.

Figure 1C:
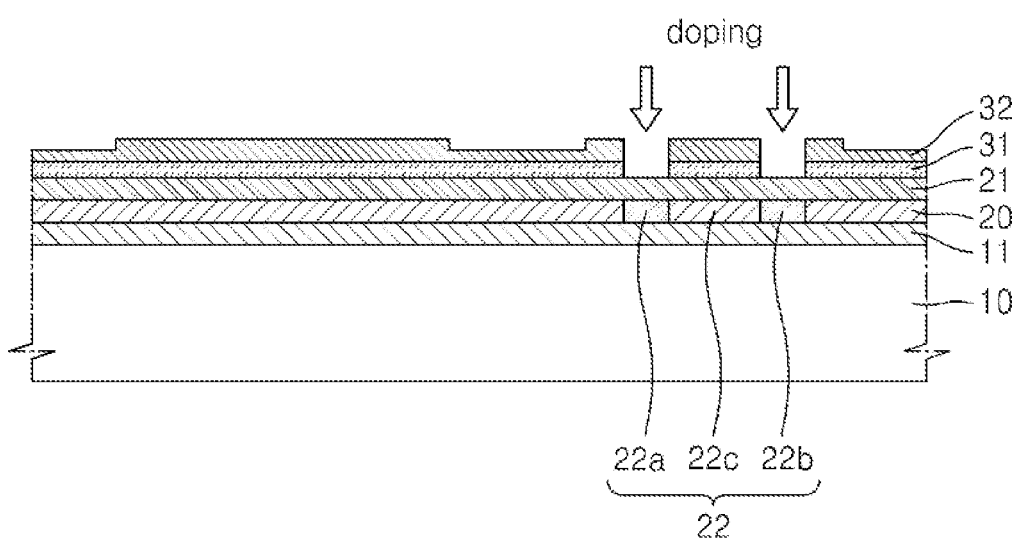

FIG. 1C shows the state when the primary patterning process is finished. In FIG. 1C, the portions where the conductive layers 31 and 32 are entirely removed become portions to be connected to the source and drain electrodes that are parts of the active layer. In this state, if n-type or p-type impurities are doped, an area where the metal layer 31 remains by about 50% is not doped with the n-type or p-type impurities because the metal layer 31 serves as a mask, and only the silicon layer 20 where the conductive layers 31 and 32 are entirely removed including the metal layer 31 is deposited. Thus, doping silicon portions 22a and 22b having conductivity by the silicon layer 20 formed of an intrinsic silicon material are formed. The active layer 22 includes the doping silicon portions 22a and 22b and an intrinsic silicon portion 22c interposed between the doping silicon portions 22a and 22b. In other words, as described above, the active layer 22 may be formed without patterning the active layer 22 by using a separate mask.

Figure 1D:
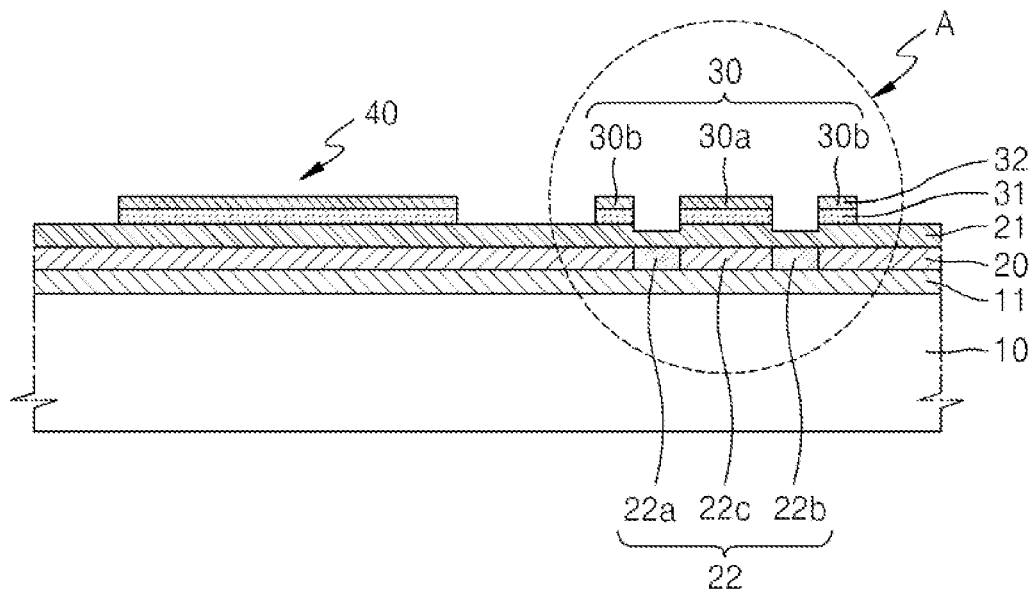

Then, a pattern shown in FIG. 1D is formed by removing the conductive layers 31 and 32 in an area where the metal layer 32 remains by about 50% through a secondary patterning process including an additional etching operation. In this regard, reference numeral 30 denotes the gate electrode of the TFT, and reference numeral 40 denotes the pixel electrode of the organic light-emitting device.

Figure 2:
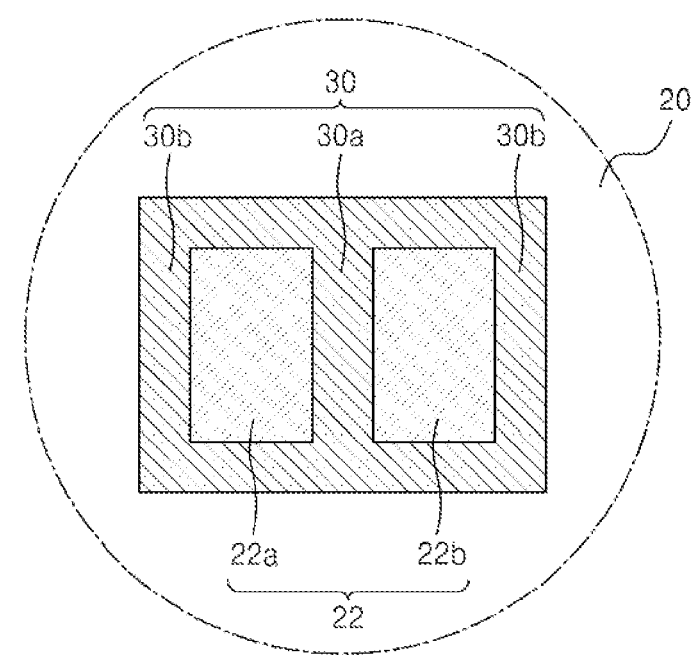
FIG. 2 is a planar view of a part 'A' of FIG. 1D.

FIG. 2 is a planar view of a part 'A' in which the gate electrode 30 is formed. In this regard, for ease of understanding a structure of the silicon layer 20, the first insulating layer 21 is not shown in FIG. 2.

As shown in FIG. 2, the silicon layer 20 is wholly formed of an insulating intrinsic silicon material, and only an area doped with impurities is changed into the doping silicon portions 22a and 22b that are parts of the active layer 22 and have conductivity as described above. Accordingly, although the active layer 22 is not patterned by using a separate mask, the doping silicon portions 22a and 22b of the active layer 22 are surrounded by the silicon layer 20 formed of an insulating intrinsic silicon material, and thus the active layer 22 may be easily separated electrically from adjacent elements.

The gate electrode 30 includes a gate central portion 30a facing the active layer 22 and a gate peripheral portion 30b having a closed-loop shape and surrounding the gate central portion 30a. The n-type or p-type impurities are injected into the silicon layer 20 via a space between the gate central portion 30a and the gate peripheral portion 30b, thereby forming the doping silicon portions 22a and 22b.

Figure 1E:
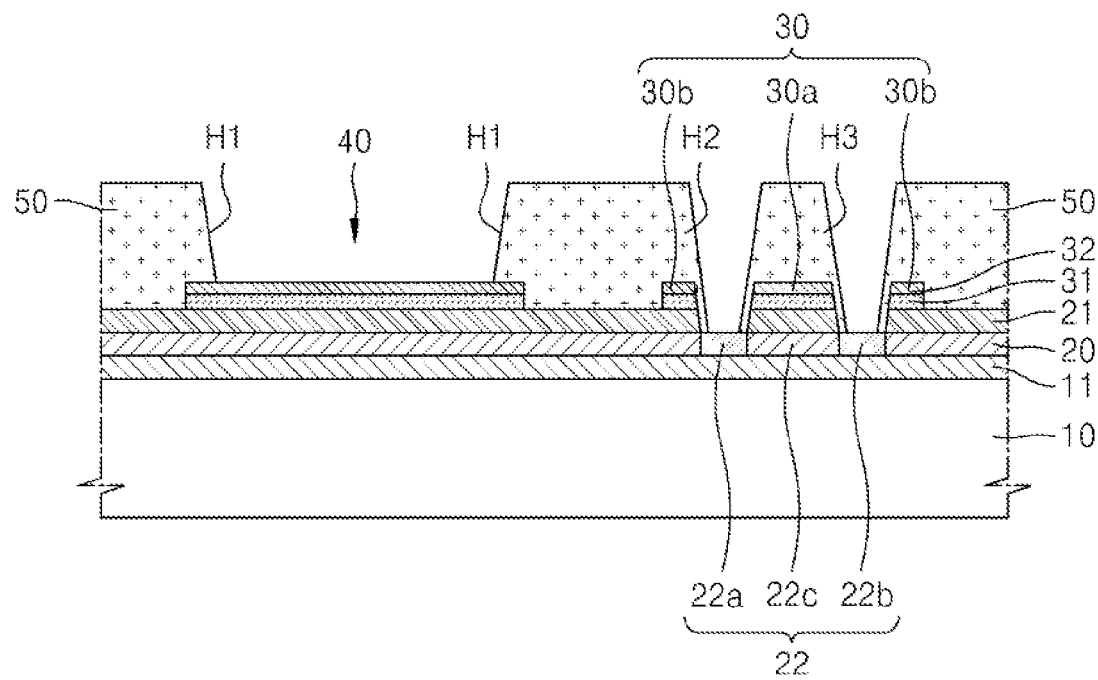

Then, as shown in FIG. 1E, a second insulating layer 50 is deposited on the entire surface of the substrate 10, and then openings H1, H2, and H3 having predetermined patterns are formed through a mask process using a second mask (not shown). The openings H1, H2, and H3 expose the pixel electrode 40 of the organic light-emitting device, and also expose the doping silicon portions 22a and 22b through spaces between the gate central portion 30a and the gate peripheral portion 30b of the gate electrode 30.

In this regard, the second insulating layer 50 may be formed of, for example, at least one organic insulating material selected from the group consisting of polyimide, polyamide, an acryl resin, benzocyclobutene, and a phenol resin, by spin-coating.

Figure 1F:
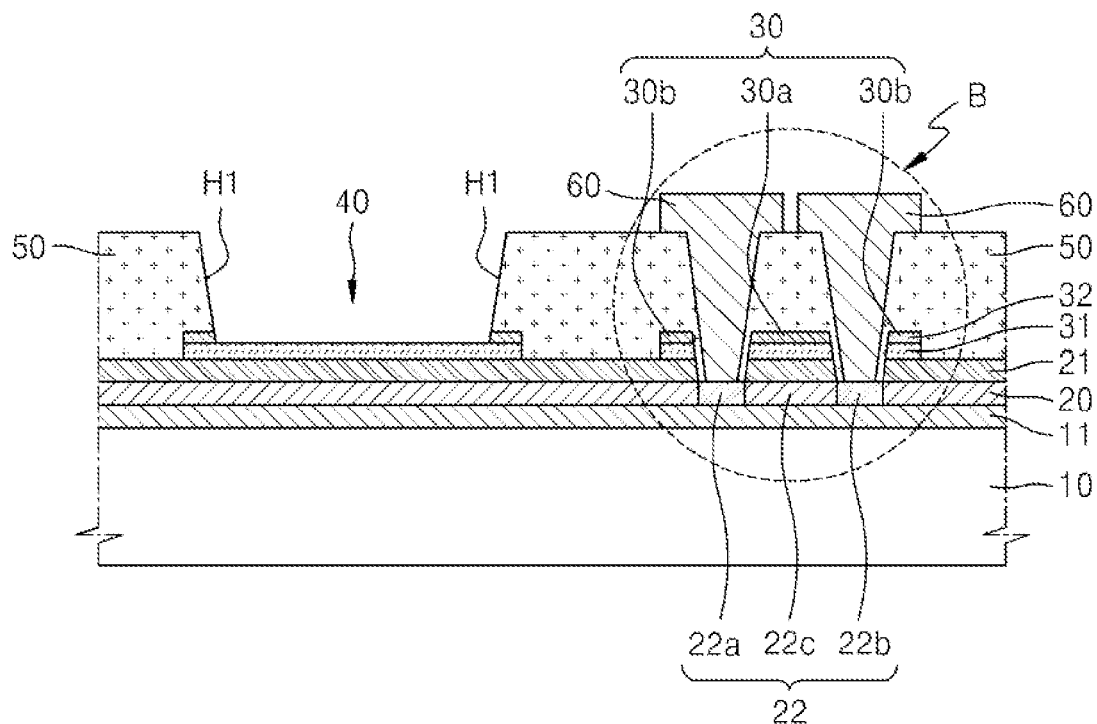

Then, as shown in FIG. 1F, a conductive layer is deposited on the entire surface of the substrate 10, and then source and drain electrodes 60 are formed through a mask process using a third mask (not shown). The conductive layer may be formed of a metal having a sufficient thickness to the extent that the openings H1, H2, and H3 may be filled by the conductive layer, and then other elements are removed through a mask process except for the source and drain electrodes 60.

Figure 3:
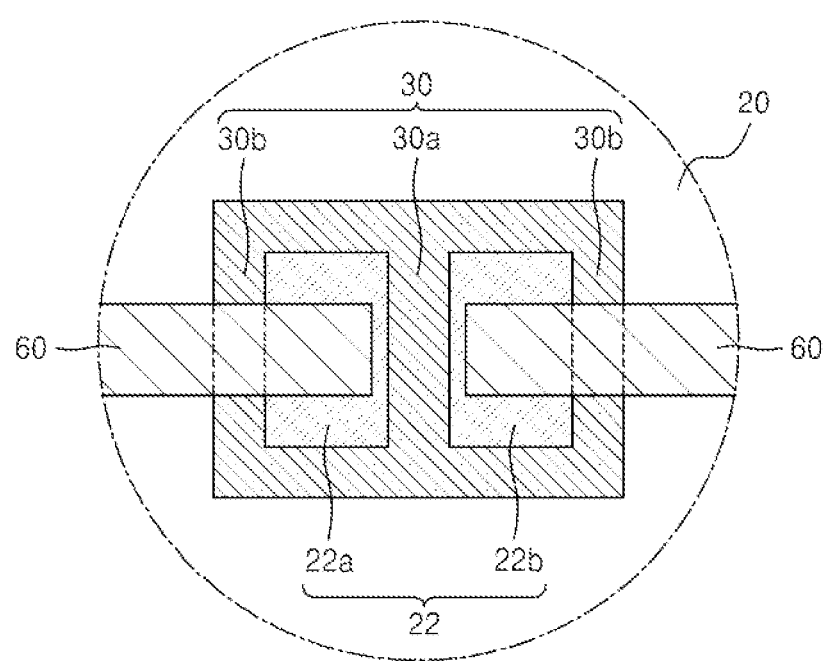
FIG. 3 is a planar view of a part 'B' of FIG. 1F.

FIG. 3 is a planar view of a part 'B' shown in FIG. 1F. In the pixel electrode 40 of the organic light-emitting device, the metal layer 32 is removed by etching, and only the transparent material layer 31 remains to be adapted for bottom emission.

Figure 1G:
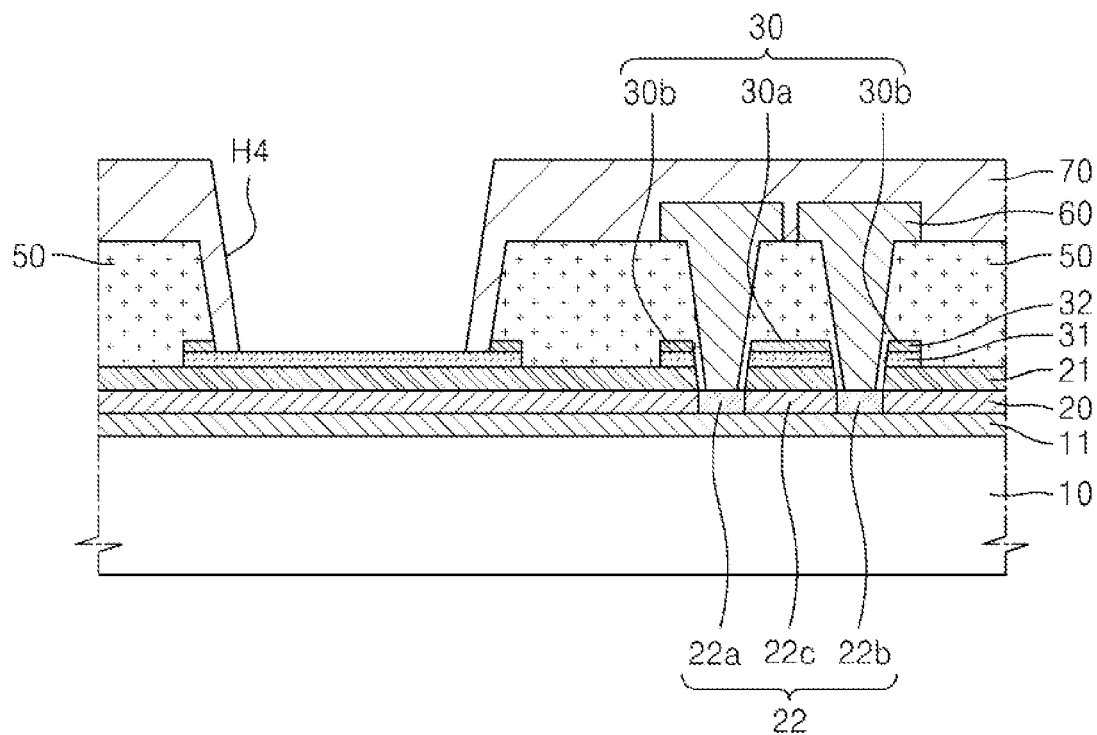

Then, as shown in FIG. 1G, a pixel define layer 70 is formed over the substrate 10. The pixel define layer 70 may be formed of, for example, at least one organic insulating material selected from the group consisting of polyimide, polyamide, an acryl resin, benzocyclobutene, and a phenol resin, and an opening H4 for exposing a central portion of the pixel electrode 40 is formed through a mask process using a fourth mask (not shown).

Figure 1H:
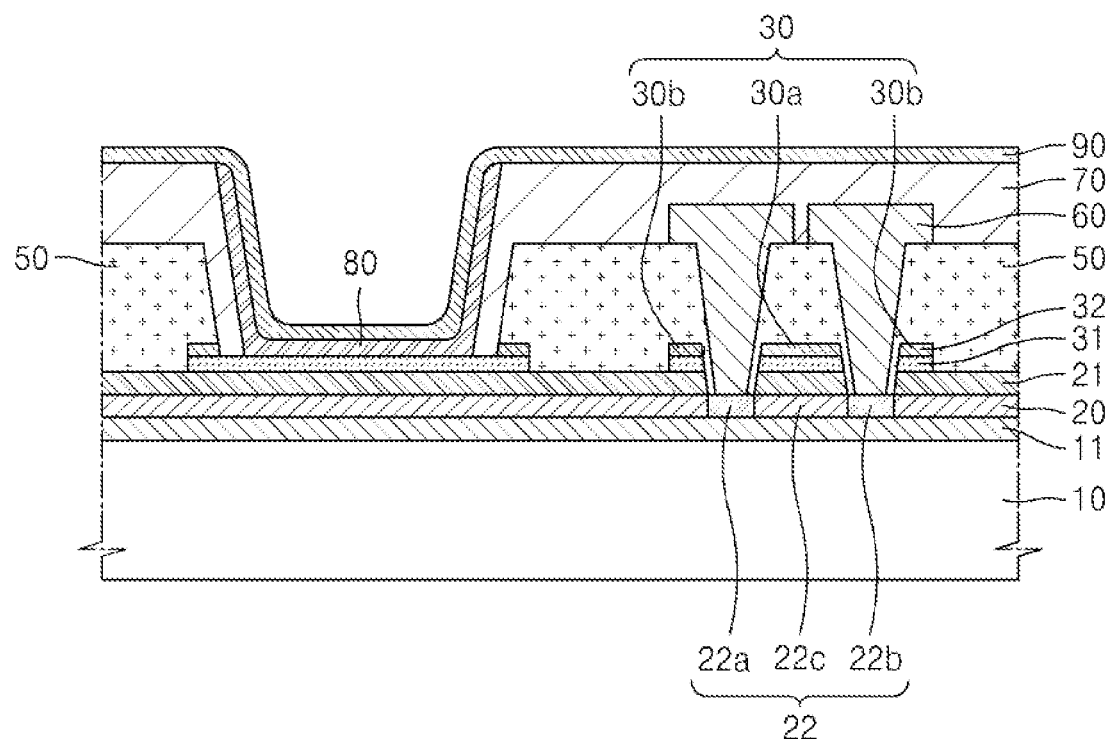

Then, as shown in FIG. 1H, an emission layer 80 and a counter electrode 90 are formed on the pixel electrode 40.

Meanwhile, although shown in the drawing, a sealing member (not shown) for protecting an organic emission layer against external moisture or oxygen, a moisture absorbent (not shown), etc. may further be formed on the counter electrode 90.

Therefore, according to an organic light-emitting display device and a method of manufacturing the same of the present invention, a substrate and a pixel define layer can be formed by performing only four mask processes, thereby reducing manufacturing costs due to a reduction in the number of masks and simplifying the manufacturing process of the organic light-emitting display device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
   a silicon layer formed on a substrate; and
   a thin film transistor (TFT) and an organic light-emitting device that are formed on the silicon layer;
   the silicon layer comprises a conductive doping silicon portion for forming a part of an active layer included in the TFT, and an electrically insulating, intrinsic silicon portion surrounding the doping silicon portion.

2. The organic light-emitting display device of claim 1, the TFT comprises a gate electrode facing the active layer and source and drain electrodes connected to the doping silicon portion.

3. The organic light-emitting display device of claim 2, the gate electrode comprises a gate central portion facing the active layer and a gate peripheral portion having a closed-loop shape and extending from the gate central portion.

4. The organic light-emitting display device of claim 3, the source and drain electrodes pass through via a space of the closed-loop and are connected to the doping silicon portion.

5. The organic light-emitting display device of claim 1, the organic light-emitting device comprises a pixel electrode electrically connected to the TFT, a counter electrode facing the pixel electrode, and an emission layer interposed between the pixel electrode and the counter electrode.

6. The organic light-emitting display device of claim 1, the silicon layer comprises a silicon layer, formed of an electrically insulating, intrinsic silicon material, over an entire area of the substrate bearing the organic light-emitting device and the TFT.

7. The organic light-emitting display device of claim 1,
   the TFT comprises a gate electrode facing the active layer and source and drain electrodes connected to the doping silicon portion;
   the silicon layer comprises a silicon layer, formed of an electrically insulating, intrinsic silicon material, over an entire area of the substrate bearing the organic light-emitting device and the TFT; and
   a gate electrode formed to comprise a gate central portion facing a part of the active layer and a gate peripheral portion having a closed-loop shape extending from the gate central portion.

8. The organic light-emitting display device of claim 1,
   the TFT comprises a gate electrode facing the active layer and source and drain electrodes connected to the doping silicon portion;
   the silicon layer comprises a silicon layer, formed of an electrically insulating, intrinsic silicon material, over an entire area of the substrate bearing the organic light-emitting device and the TFT; and
   a gate electrode formed to comprise a gate central portion facing a part of the active layer and a gate peripheral portion having a closed-loop shape extending from the gate central portion; and
   the silicon layer being formed of an electrically insulating, intrinsic silicon material located at an outer side of the gate peripheral portion.

9. The organic light-emitting display device of claim 1, comprised of a gate electrode formed to comprise a gate central portion facing a part of the active layer and a gate peripheral portion having a closed-loop shape extending from the gate central portion.

10. The organic light-emitting display device of claim 1, comprised of a gate electrode formed to comprise a gate central portion facing a part of the active layer and a gate peripheral portion having a closed-loop shape extending from the gate central portion, the doping silicon portion of the TFT being located at an inner side of the gate peripheral portion, and the silicon layer being formed of an electrically insulating, intrinsic silicon material located at an outer side of the gate peripheral portion.

* * * * *